(12) United States Patent
Wu (10) Patent No.: US 8,308,843 B2
(45) Date of Patent: Nov. 13, 2012

(54) METHOD AND DEVICE USING PYROLYSIS FOR RECYCLING USED PRINTED CIRCUIT BOARD

(76) Inventor: Hsieh-Sen Wu, Tao Yuan County (TW)

( * ) Notice: Subject to any disclaimer, the term of this patent is extended or adjusted under 35 U.S.C. 154(b) by 244 days.

(21) Appl. No.: 12/788,039

(22) Filed: May 26, 2010

(65) Prior Publication Data

US 2010/0300865 A1    Dec. 2, 2010

(30) Foreign Application Priority Data

May 27, 2009   (TW) ............................... 98117604 A (51) Int. Cl.
*C22B 1/00*   (2006.01)
*C22B 9/02*   (2006.01)
*C22B 15/00*  (2006.01)
*C22B 25/06*  (2006.01)
*C23G 1/28*   (2006.01)

(52) U.S. Cl. ............... 75/402; 75/420; 75/432; 75/429; 210/750; 29/403.1; 29/403.2; 29/403.3; 29/403.4

(58) Field of Classification Search ................ 75/402, 75/420, 432, 429; 210/750; 29/403.1–403.4
See application file for complete search history.

(56) References Cited

U.S. PATENT DOCUMENTS 6,089,479 A *   7/2000 Chang et al. ................ 241/17
2007/0169330 A1 * 7/2007 Wu ............................ 29/403.3

\* cited by examiner

*Primary Examiner* — George Wyszomierski
*Assistant Examiner* — Tima M McGuthry Banks
(74) *Attorney, Agent, or Firm* — Pai Patent & Trademark Law Firm; Chao-Chung David Pai (57) ABSTRACT

A method and a device using pyrolysis for recycling used printed circuit board in which water (moisture) is introduced in the pyrolysis process and a fully sealed low pressure environment is established to ensure that no combustion happens in the pyrolysis process to enhance the safety of the process; pyrolysis gases generated in the process are concentrated and purified to provide useful fuels or chemical materials; therefore, the present invention can reduce process cost, improve recycling efficiency and provide processing device with high safety, thereby enhancing industry usability.

5 Claims, 8 Drawing Sheets

Fig. 1

PRIOR ART

METHOD AND DEVICE USING PYROLYSIS FOR RECYCLING USED PRINTED CIRCUIT BOARD

BACKGROUND OF THE INVENTION

1. Field of the Invention

The present invention relates to a method and a device using pyrolysis for recycling used printed circuit board, and more particularly, to a method and a device using pyrolysis for recycling used printed circuit board which can greatly enhance the safety of the pyrolysis process, improve the reusability of the pyrolysis gas, strengthen the stability of the processing device, ensure the safety of the operator and reduce the cost.

2. Description of the Prior Art

Figure 1:
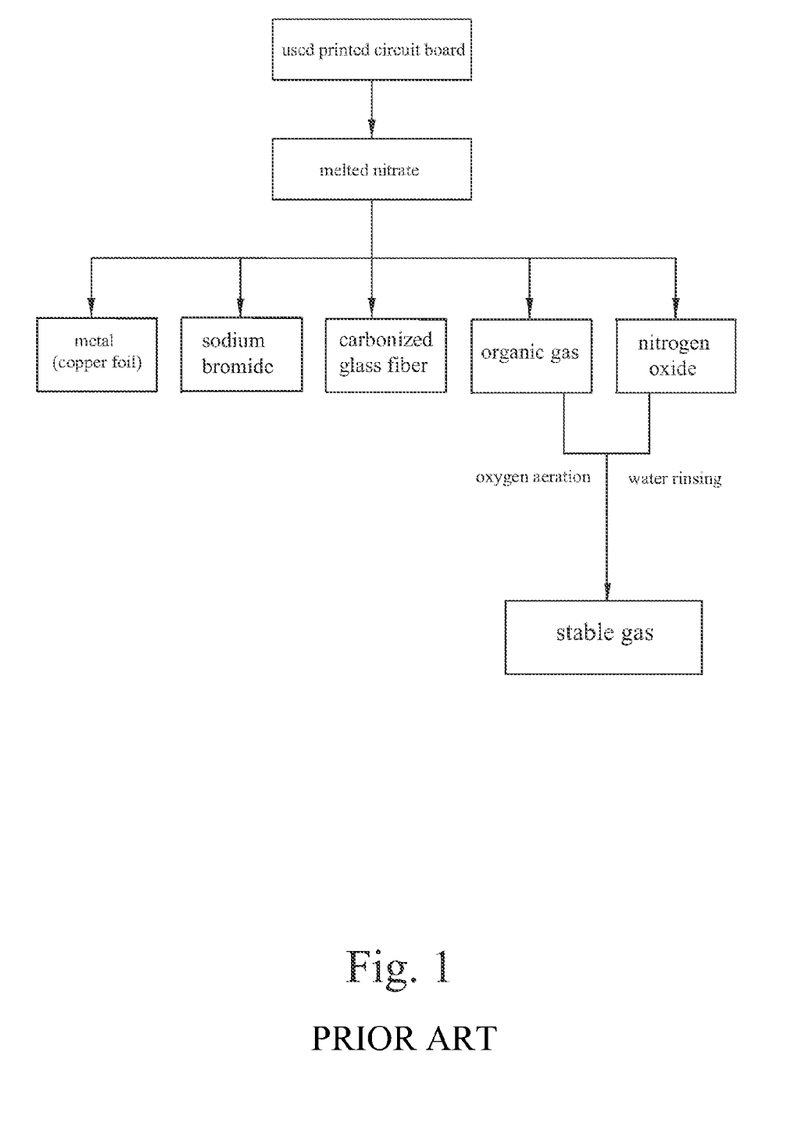
FIG. 1 illustrates a flow chart of a prior art pyrolysis process for thermally decompose a used printed circuit board.

The inventor of this invention has disclosed the Taiwan Patent Application No. 095102342 titled "The method for recycling used printed circuit board" in Jan. $20^{th}$, 2006 and been awarded Taiwan Patent No.I268184 for the same case, which shows great values in using melted nitrate to thermally decompose the epoxy resin of the printed circuit board. In the method, a printed circuit board (PCB) is dipped into the melted nitrate to thermally decompose the brominated epoxy resin in the PCB and to generate a great amount of organic gas and nitrogen oxide ($NO_x$) through chemical reactions, as shown in FIG. 1. However, when a high concentration of organic gas happens to be mixed with oxygen (or air) in high temperature, there could be combustion (which could easily lead to fire and air blast) in the processing system; besides, when oxygen is introduced to incinerate the organic gas, extra energy is required to carry out the process; therefore, processing cost could increase. The factors affecting the processing efficiency in the pyrolysis process are listed as follows:

(1) The amount of gas generated by the pyrolysis process increases as the temperature rises, and it is difficult to control the amount of gas as the temperature goes even higher; which could pose a security threat to the operator.

(2) the used PCB will float on the processing fluid in the pyrolysis process; besides, when the PCB is horizontally inserted in the reactor, the glass fiber and the copper foil of the PCB will block the discharging path of the pyrolysis gas under the PCB and also make it difficult for the PCB to react in the pyrolysis process; therefore, when the operator tries to take out the processed PCB, a huge amount of gas will blow off and pose a security threat to the operator.

(3) In the pyrolysis process, if outside air comes in the reactor when the temperature is high, a fire or air blast could occur, the higher the temperature, the more likely it happens, which could pose a security threat to the operator.

(4) During the operation a lot of carbon residues will gather on the surface of the melted nitrate, the amount of the carbon residue is inversely proportional to the amount of gas, which is even more when the temperature is below 370° C.; since carbon only decomposes under very high temperature, and there's some gas hidden under the carbon residue, so the operator could encounter some risks when he/she tries to take out the carbon residue.

(5) When using oxygen to aerate the pyrolysis process, the added oxygen and the uncertainty of the amount of generated gas require more operating cost.

(6) Using blower to discharge the pyrolysis gas for oxygen aeration is not effective, meanwhile, the reactor could be in negative pressure to let outside air come in (which could lead to fire and air blast more easily); therefore, the system could be unstable and affect the operating efficiency.

(7) When the used PCB is inserted to/removed from the reactor in the pyrolysis process, outside air could come in the reactor and pose a huge risk; besides, the glass fiber on the used PCB could be damaged by the melted nitrate.

(8) Since the inlet of the reactor is disposed at a side of the reactor while the gas exhaust outlet is disposed on top thereof, a chimney effect could happen and let a huge amount of outside air come in the reactor, posing a great risk in operation.

Due to these phenomenons, it is necessary to propose a unique method for enhance the operating safety and the recycling efficiency when using the melted nitrate to thermally decompose the used PCB.

Therefore, the prior-art technique presents some shortcomings to be overcome.

In view of the deficiencies of the prior-art technique, after years of constant effort, the inventor has consequently invented and disclosed a method and a device using pyrolysis for recycling used printed circuit board in the present invention.

SUMMARY OF THE INVENTION

It is an object of the present invention to provide a method and device which can ensure the safety of the pyrolysis process by preventing combustion in the reactor, thereby protecting the operator and ensuring the safety of the working environment.

It is another object of the present invention to treat the pyrolysis gas by condensation and purification to obtain reusable fuel or chemical materials, thereby greatly reducing processing cost, improving recycling efficiency and providing processing device with high safety to enhance industry usability.

In order to achieve the above objects, the present invention discloses a method and a device using pyrolysis for recycling a used printed circuit board, which comprises:

(a) The present invention discloses a method using pyrolysis for recycling a used printed circuit board (PCB), wherein the PCB is dipped in the reactor, moisture is introduced in the pyrolysis process to cool down the melted nitrate and to stabilize the reaction, thereby keeping the reactor in the positive pressure condition and to forcibly discharge the organic gas out of the reactor with vaporized steam; furthermore, the vapor can drive out the air comes with the reactant, while water can cool down the reactant and the melted nitrate to make the system more stable; during the reaction, the moisture does not dilute the organic gas and does not affect the condensing operation.

(b) The present invention can condense the pyrolysis gas generated in the pyrolysis process in the room temperature into condensable fuels (big molecule, high ignition point) and incondensable gas (small molecule and low ignition point) and separate them for better recycling efficiency, thereby saving more energy and reduce carbon emission.

(c) In the pyrolysis process, there are sill many unstable conditions which need to be overcome; therefore, in carrying out the pyrolysis process, a complete protecting mechanism must be established in advance as follows:

(1) Establishing a positive pressure oxygen isolation system: the pyrolysis process is designed to operate under a positive pressure condition to keep the outside air from coming in and to ensure the safety in operation; when the reactant is removed from the reactor, the inflated moisture can establish a positive pressure environment to safely transfer the reactant;

(2) Introducing a moisture-based reaction stabilizing system: the present invention uses moisture to cool down the over-reaction of the pyrolysis process and to stabilize the pyrolysis process; besides, when the reactant is cooled before moving out of the reactor, thereby enhancing the safety of the pyrolysis process;

(3) Establishing an automatic gas balancing system, in order to deal with the extra amount of gas generated during the pyrolysis process, an additional space is required for storing the gas to keep the pressure from rising; therefore, the present invention discloses an automatic gas balancing system which is inflatable to accommodate extra gas and return to its original size to balance the operating pressure;

(4) Establishing a vertical feeding system: in order to eliminate the chimney effect, the present invention propose a vertical feeding system, which could prevent outside air from coming in since the hot used gas will go upward; furthermore, the introduced moisture can be heated to become vaporized steam to exclude the air coming with the reactant;

(5) Establishing a vertical reaction rack and a carbon residue removing system: in order to solve the problem that the PCB could block the discharging path of the organic gas and the carbon residue floats on the surface of the melted nitrate, a vertical reaction rack is installed to let the PCBs stand upright without overlapping, and the melted nitrate only comes into reaction at certain positions to effectively and quickly carry out the pyrolysis process, a carbon residue filtering net is disposed over the reaction rack to remove the carbon residue and to discharge the pyrolysis gas under the carbon residue so as to enhance operating safety;

(6) Establishing a reactor ventilation system: in order to prevent the pyrolysis gas from flowing back to the reactor and to discharge the pyrolysis gas smoothly, the present invention is designed such that when the water level drops, a discharging path is open, when the water level rises, then the discharging path is close, thereby controlling the ventilation function effectively;

(7) Establishing an pyrolysis gas condensing & recycling system: to improve the reusability of the pyrolysis gas, a room temperature condensing/compressing system to condense the organic gas into fuel (big molecule) and gas (small molecule) and separate them for better recycling efficiency, thereby reducing operating cost and increasing recycling value;

(8) Establishing a movable sealing door control system: in order to prevent the pyrolysis gas from flowing out when the reactant is moved out of the reactor, a movable sealing door is implemented to use a hydraulic seal and a sealing door to form a sealed space to retain the pyrolysis gas; besides, moisture is used for cooling down the reactant to get rid of the most pyrolysis gas, thereby providing a save operating environment;

(9) Establishing a reaction pressure tracking system: the present invention uses a reaction pressure tracking system to tack the beginning and the end of the pyrolysis process to determine whether the process is over or not; when the pyrolysis process starts, an amount of gas is generated to increase the pressure and when the pyrolysis process stops the pressure drops, therefore, by measuring the pressure it is possible to determine whether the pyrolysis process is over.

BRIEF DESCRIPTION OF THE DRAWINGS

The drawings disclose an illustrative embodiment of the present invention which serves to exemplify the various advantages and objects hereof, and are as follows.

[Reference Numerals]

| | | | |
|---|---|---|---|
| 100 | reactor | 101 | reactor heater |
| 102 | melted nitrate | | |
| 103 | gas buffer zone | | |
| 104 | movable sealing door | 105 | cover |
| 106 | reactant transfer rack | | |
| 107 | reaction rack transfer driver | | |
| 108 | reaction rack feed driver | | |
| 109 | reaction rack connector | | |
| 110 | movable reaction rack | | |
| 111 | moisture injection device | | |
| 112 | reactor exhaust outlet | | |
| 113 | movable hydraulic seal | | |
| 114 | pyrolysis gas buffer zone | | |
| 115 | water intake control valve | | |
| 116 | water discharge control valve | | |
| 117 | reactor pressure control meter | | |
| 118 | automatic inflation device for gas | | |
| 119 | safety device | | |
| 120 | reactant | | |
| 200 | pyrolysis gas condensing & recycling device | | |
| 201 | condensing tube | | |
| 202 | condensing & spraying device | | |
| 203 | hydraulic seal | 204 | tar |
| 205 | gas outlet | 206 | pressurizing pump |
| 207 | tar outlet | | |
| 208 | gas & water separating tank | | |
| 209 | liquid | | |
| 210 | temporary gas storage zone | | |
| 300 | pipe | 400 | waste gas processing device |
| 500 | gas exhaust outlet | | |

DETAILED DESCRIPTION OF THE PREFERRED EMBODIMENT

Figure 2:
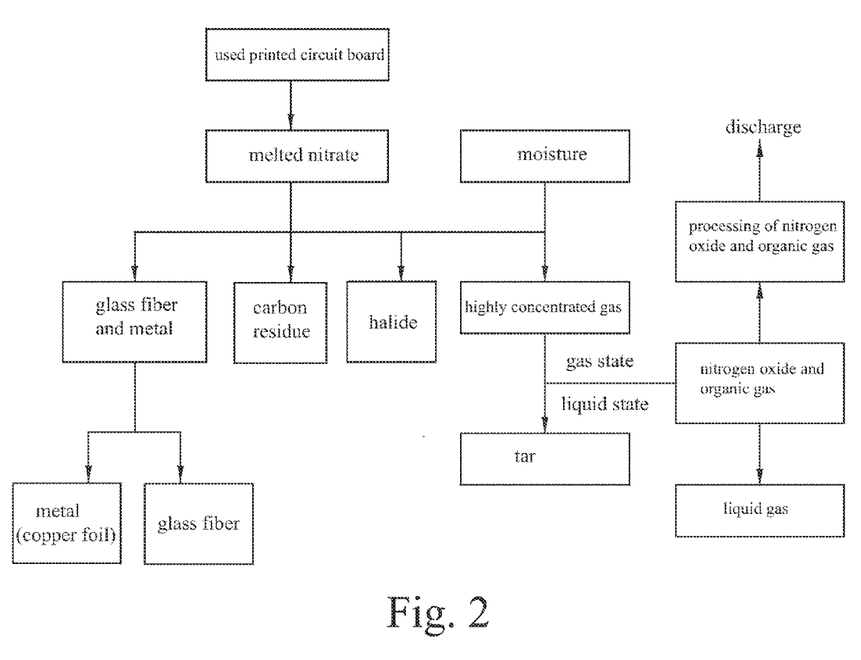
FIG. 2 illustrates a pyrolysis recycling flow of a method and a device using pyrolysis for recycling a used printed circuit board.

Please refer to FIG. 2 for a pyrolysis recycling flow of a method and a device using pyrolysis for recycling the used printed circuit board, in which a reactant (used PCB) is dipped into melted nitrate having a temperature of 300~550, so the brominated epoxy resin in the reactant is thermally decomposed to generate the organic gas, nitrogen oxide and carbon residue; as to the bromine element in the epoxy resin, highly active metal ion in the nitrate such as lithium, sodium, potassium is used to capture bromine to form stable bromate; furthermore, moisture is introduced to stabilize the pyrolysis process to keep the nitrate from over-reacting (which could cause air blast) intensely, and the moisture is vaporized to create a positive pressure environment to forcibly blow off the pyrolysis gas in the reactor; moisture is heated to go upward to eliminate the outside air coming in with the reactant (such as used PCB) as it is inserted in the reactor; moreover, the reactant is cooled by moisture before moving out of the reactant to provide better operating safety; as to the organic gas generated in the pyrolysis process, it is condensed in the room temperature into condensable fuel (big molecule), which can be further combined with carbon ash to form tar, and incondensable gas (small molecule), then they are separated for better reactant recycling efficiency, thereby saving more energy and reduce the cost of the pyrolysis process; the incondensable gas comprising nitrogen oxide and organic gas is further separated and compressed, the generated nitrogen oxide and organic gas can be discharged or compressed to form liquidized gas. Furthermore, the carbon film generated after the pyrolysis process is rinsed by water; since the salt inside the carbon film is soluble in water and carbon is not soluble in water, the carbon residue can be separated easily to be used as a fuel or chemical materials (such as carbon black or active carbon); the processing of fiber glass and metals depends on whether a pre-processing is executed or not; if so then tin is stripped off from the copper foil, if not then tin is mixed with copper foil; if the solder mask copper foil is melted, then the glass fiber and metals can be separated easily (such as a double layer PCB), if the solder mask copper foil is not melted or the used printed circuit board contains more than six layers of layout, then the copper foil is separated from the used printed circuit board by applying an external force or a chemical solution or both to obtain a metallic compound or the metal through chemical reduction. The metal element can be retrieved from the metal compound solution by reduction, or the metal compound is recycled instead. It is not difficult to separate the bromate and the nitrate in the melted nitrate since they have different densities and melting points.

And the reactant (used PCB) can be pre-processed in advance or not.

Figure 3:
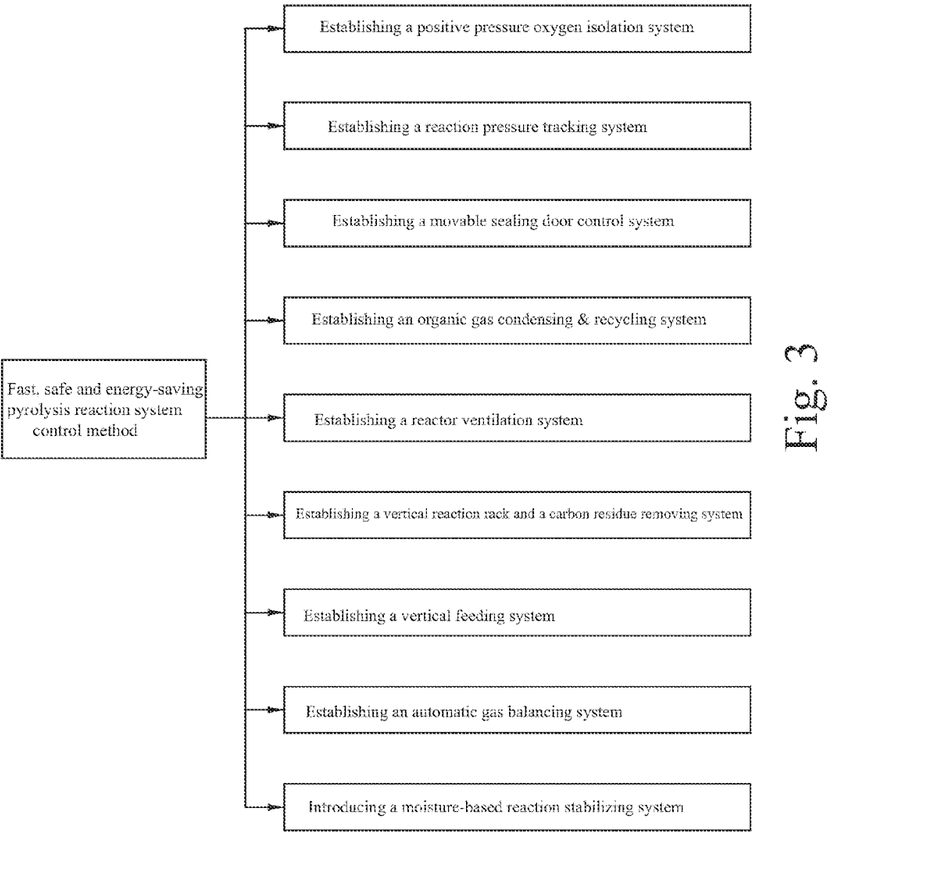
FIG. 3 illustrates a system view of a method and a device using pyrolysis for recycling a used printed circuit board.

Please refer to FIG. 3 for a system view of a method and a device using pyrolysis for recycling used printed circuit board, in the pyrolysis process, there are still many unstable conditions which need to be overcome, for example, a great amount of gas is generated and combustion (fire or air blast) could happen, it is necessary to establish an efficient, safe and energy-saving pyrolysis system; therefore, in carrying out the pyrolysis process, a complete protecting mechanism must be established in advance as follows:

(1) Establishing a positive pressure oxygen isolation system: the pyrolysis process is designed to operate under a positive pressure condition to keep the outside air from coming in and to ensure the safety in operation; moisture is introduced before and after the pyrolysis reaction to be heated by the melted nitrate to forcibly blow off the pyrolysis gas in the reactor so as to reduce the risk of pyrolysis gas blast; besides, moisture is heated to go upward to eliminate the outside air coming in with the reactant (such as used PCB) as it is inserted in the reactor.

(2) Introducing a moisture-based reaction stabilizing system: the present invention uses moisture to cool down the over-reaction of the pyrolysis process and to stabilize the pyrolysis process; besides, when the reactant is cooled before moving out of the reactor, thereby enhancing the safety of the pyrolysis process; wherein the moisture can be a small amount of water, vaporized moisture, steam, inert gas or the like to carry out the same function.

Figure 4:
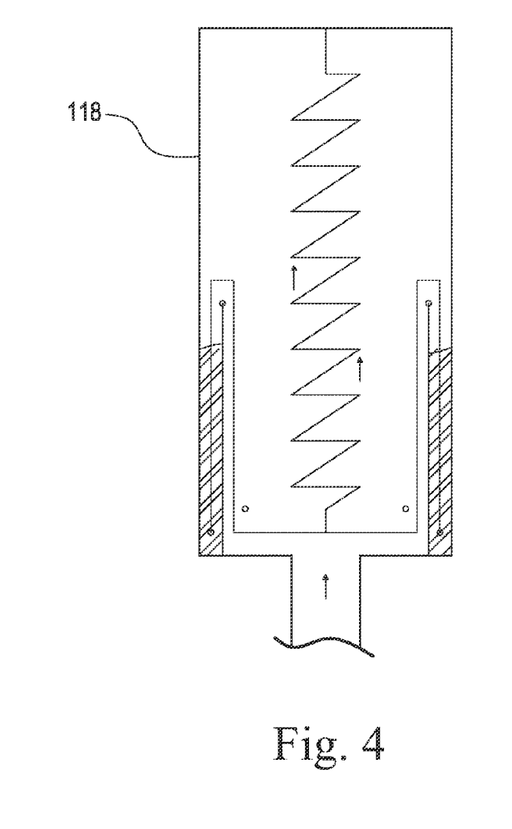
FIG. 4 illustrates a structural view of an automatic inflation device for gas of a method and a device using pyrolysis for recycling a used printed circuit board.
Figure 5:
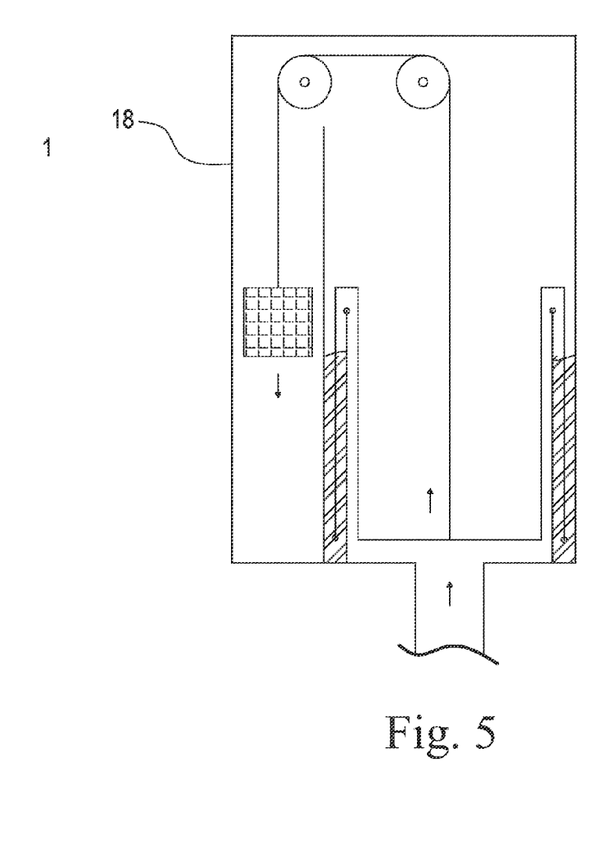
FIG. 5 illustrates another structural view of an automatic inflation device for gas of a method and a device using pyrolysis for recycling a used printed circuit board.

(3) Establishing an automatic gas balancing system, in order to deal with the varying amount of gas generated during the pyrolysis process, wherein the pressure goes up quickly as the amount of gas increases, the generated gas could become the burden of the system and pose a threat to the operation, therefore the system has to expand to accommodate the extra amount of gas to balance the system pressure, however, system expansion leads to high equipment cost and handling problems; on the other hand, when the system is not in a pyrolysis process, the pressure drops as no gas is generated. Therefore, an additional space is required for storing the gas to keep the pressure from rising; therefore, the present invention discloses an automatic gas balancing system which is inflatable to accommodate extra gas and return to its original size to balance the operating pressure; the automatic gas balancing system can be implemented with a spring mechanism to enhance its sensitivity (as shown in FIG. 4), or it can be implemented with a balance wheel to enhance the inflation sensitivity (as shown in FIG. 5); besides, the device can use a hydraulic seal or a oil seal to provide a fully sealed inner space.

(4) Establishing a vertical feeding system: in order to eliminate the chimney effect, the present invention propose a vertical feeding system, which could prevent outside from coming in since the hot used gas will go upward; furthermore, the introduced moisture can be heated to become vaporized steam to exclude the air coming with the used PCB when it is inserted into the reactor; thereby eliminating oxygen in the reactor and improving system security.

(5) Establishing a vertical reaction rack and a carbon residue removing system: to solve the problem that glass fiber and copper foil of the PCB could block the discharging path of the organic gas and the carbon residue floats on the surface of the melted nitrate, a vertical reaction rack is installed to let the PCBs stand upright without overlapping, and the melted nitrate only comes into reaction at certain positions to effectively and quickly carry out the pyrolysis process, a carbon film filtering net is disposed over the reaction rack to remove the carbon residue and to discharge the pyrolysis gas under the carbon residue so as to enhance operating safety; it is necessary to install the carbon film filtering net on the reaction rack to ensure that all reactants are removed from the reactor and the reactor returns to its original state.

(6) Establishing a reactor ventilation system: in order to prevent the pyrolysis gas from flowing back to the reactor and to discharge the pyrolysis gas smoothly, the present invention is designed such that when the water level drops, a discharging path is open, when the water level rises, then the discharging path is close, thereby controlling the ventilation function effectively;

(7) Establishing an pyrolysis gas condensing & recycling system: to improve the reusability of the pyrolysis gas for saving energy and reducing carbon emission, an pyrolysis gas condensing & recycling system is proposed, wherein the pyrolysis gas comprises various elements having different melting points, it would takes a lot of fuels to burn all of them, therefore, a room temperature condensing/compressing system is used to condense the pyrolysis gas into fuel (big molecule) which can be further combined with carbon ash to form tar to be treated as fuel or chemical material, and incondensable gas (small molecule) can be introduced into a combustion device for generating heat, electricity or processed by a traditional organic gas and nitrogen gas (VOCs) processing device, or being compressed to form liquidized gas. The pyrolysis gas condensed in the room temperature is obtained by mixing water and the pyrolysis gas or mixing oil (fuel or hot kerosene) and the pyrolysis gas, or using an indirect heat changer to condense the pyrolysis gas and to recycle the fuel.

(8) Establishing a movable sealing door control system, in order to prevent the pyrolysis gas from flowing out when the reactant is removed from the reactor, a movable sealing door is implemented to use a hydraulic seal and a sealing door to form a sealed space to retain the pyrolysis gas; besides, moisture is used for cooling down the reactant to get rid of the most pyrolysis gas, thereby providing a save operating environment;

(9) Establishing a reaction pressure tracking system: the present invention uses a reaction pressure tracking system to track the beginning and the end of the pyrolysis process to determine whether the process is over or not; when the pyrolysis process starts, an amount of gas is generated to increase the pressure and when the pyrolysis process stops the pressure drops, therefore, by measuring the pressure it is possible to determine whether the pyrolysis process is over, which is more efficient than tracking temperature.

Figure 6:
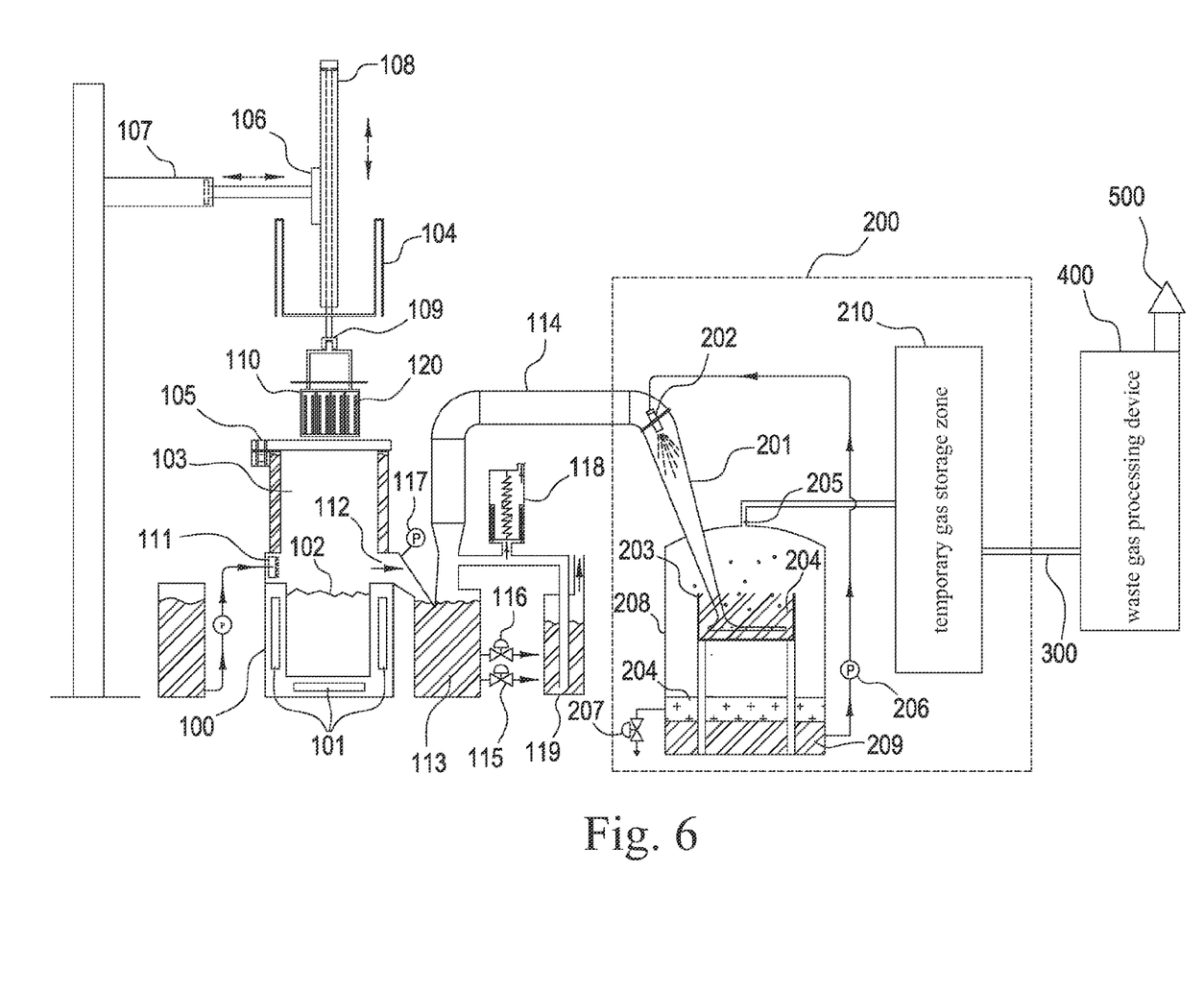
FIG. 6 illustrates a total structural view of a method and a device using pyrolysis for recycling a used printed circuit board.
Figure 7A:
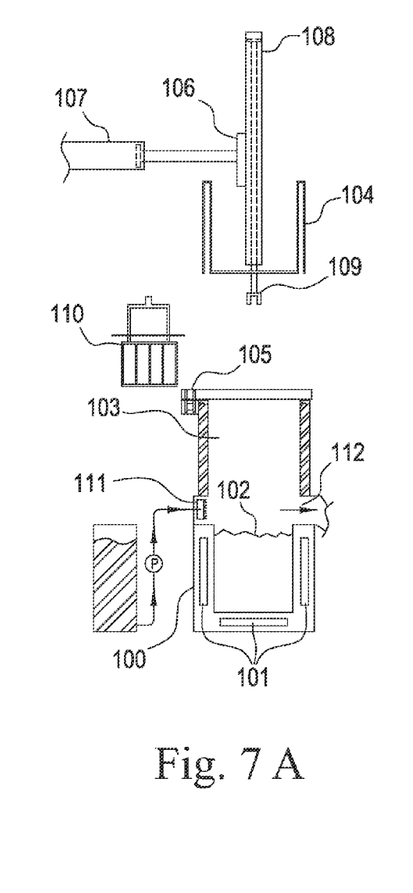
FIG. 7A to 7E illustrate implementation views of a method and a device using pyrolysis for recycling a used printed circuit board.
Figure 7B:
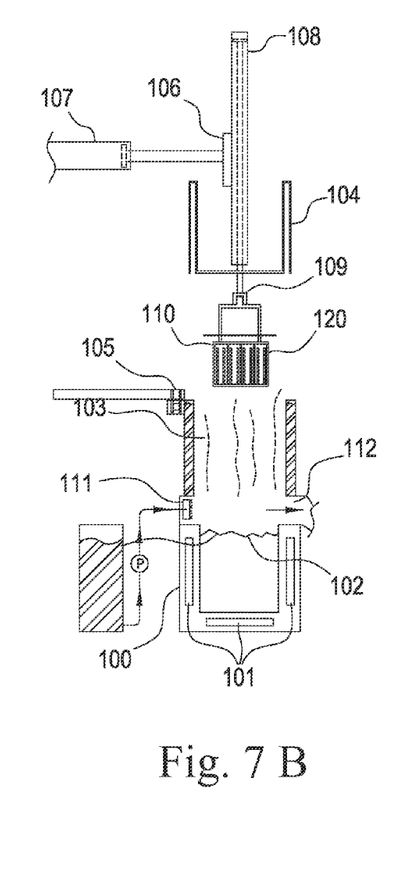
Figure 7C:
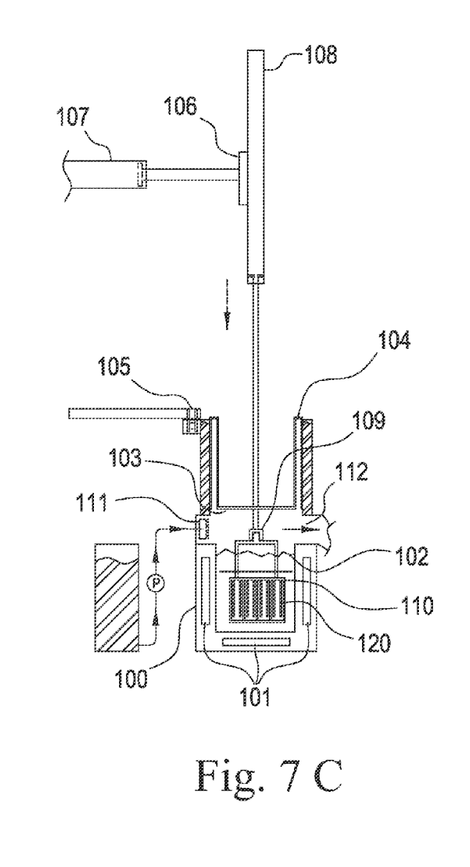
Figure 7D:
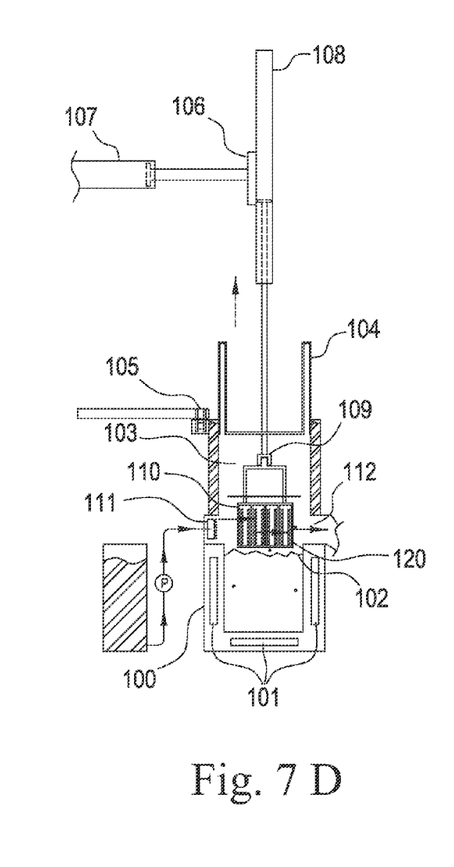
Figure 7E:
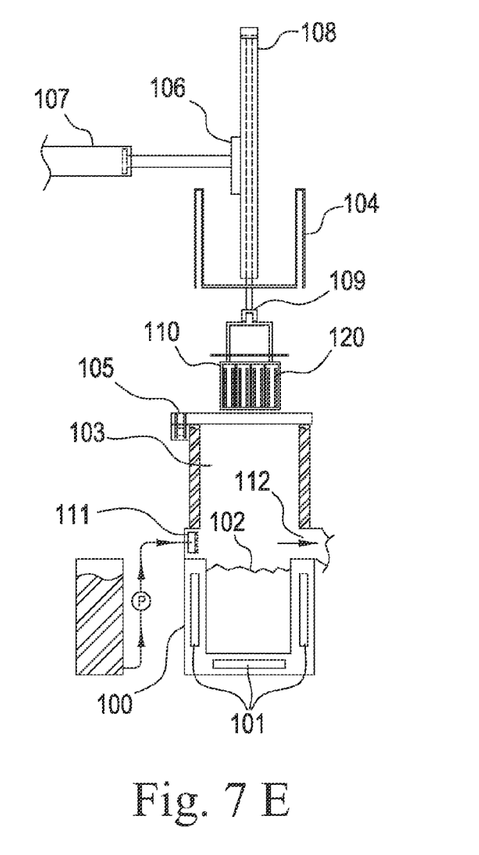

Please refer to FIG. 6 for a complete structural view of a method and a device using pyrolysis for recycling used printed circuit board; wherein the pyrolysis process uses melted nitrate to thermally decompose the used PCB to separate the elements for recycling, wherein the device comprises:

a reactor 100 with a reactor heater 101 disposed under and around the reactor, wherein the reactor is loaded with melted nitrate 102 at the bottom half thereof, the reactor heater 101 heats the melted nitrate 102 into a melted state; the reactor 100 comprises a gas buffer zone 103 disposed in the middle thereof, and a movable sealing door 104 and a cover 105 disposed on top of the reactor; wherein the reactor heater 101 is heated with electrical power or fuel;

a reactant transfer rack 106 mounted over the reactor 100 for transferring the reactant 120, wherein the reactant transfer rack 106 is disposed with a reaction rack transfer driver 107 and a reaction rack feed driver 108 thereon, the reaction rack transfer driver 107 can move the reactant transfer rack transversely, while the reaction rack feed driver 108 can move the reactant transfer rack vertically; the reaction rack feed driver 108 is disposed with a set of reaction rack connectors 109 which can detachably connect with the reaction rack 110 and contain the reactant 120 in the reaction rack 110, the reactant can be a used printed circuit board, the reaction rack connectors 109 connect with the reaction rack 110 mechanically or electromagnetically, the reaction rack transfer driver 107 is operated by oil pressure, air pressure, or electric screw actuator; the reaction rack feed driver 108 is operated by oil pressure, air pressure, or electric screw actuator;

a moisture injection device 111 disposed over a side of an gas buffer zone 103 of the reactor 100, wherein the moisture injection device provides a nozzle to spray the moisture onto the melted nitrate 102; therefore, when the reactant 120 is transferred into the reactor 100, the sprayed moisture is heated to expand and to push the movable sealing door 104 upward to isolate the reactor 100 from outside air to block outside air from coming in; meanwhile, the moisture can cool down the surface of the melted nitrate 102 to prevent the pyrolysis process from overheating;

an reactor exhaust outlet 112 disposed over another side of the gas buffer zone 103 of the reactor and connected with a movable hydraulic seal 113, wherein the reactor exhaust outlet 112 guides the pyrolysis gas of the reactant 120 during the pyrolysis process through the movable hydraulic seal 113 to the pyrolysis gas buffer zone 114, and the movable hydraulic seal 113 is provided for automatically lowering the water level by using a water discharge control valve 116 during the pyrolysis process, and when the pyrolysis process stops, a water intake control valve 115 is used for supplying water to form a water seal for preventing the pyrolysis gas from flowing back to the reactor; wherein the pyrolysis gas can be a nitrogen oxide or an organic gas;

a reactor pressure control meter 117 disposed over the reactor exhaust outlet 112 for measuring a pressure in the reactor 100, when the pressure rises the pyrolysis process starts, and when the pressure drops the pyrolysis process stops; therefore, by measuring the pressure and also in accordance with the time and the temperature variation, it is possible to determine whether the pyrolysis process is over and it is safe or not to remove the reactant 120;

a reaction rack 110 which is detachably connected to the front end of the reaction rack feed driver 108 for providing the space for pyrolysis reaction and for keeping the reactant 120 in the melted nitrate for pyrolysis regardless of its density; wherein the reaction rack 110 can retain an exhaust channel with a carbon residue filtering net, when the reactant 120 is removed, the carbon residue gathering on the top surface of the melted nitrate 102 is removed as well;

an automatic inflation device for gas 118, wherein the automatic inflation device 118 is disposed at a side of the pyrolysis gas buffer zone 114 for containing the gas when there's extra amount of gas, and when the amount of gas decreases, the automatic inflation device shuts off to push out the contained gas; wherein the automatic inflation device for gas can use a hydraulic seal and a spring device to enhance its sensitivity for automatically adjusting the sensitivity, or use a hydraulic seal and a balance wheel to use its weight difference to automatically adjust the sensitivity (as shown in FIG. 4 and FIG. 5), when the pressure is high, the automatic inflation device 118 turns on and vice versa;

a safety device 119 disposed at a side of the pyrolysis gas buffer zone 114, wherein the safety device discharges the pyrolysis gas when the gas pressure is greater than the pressure of the hydraulic seal to ensure the safety of the reactor structural and the safety of the operator and to prevent outside air from coming into the reactor 100;

a pyrolysis gas condensing & recycling device 200 disposed at the back end of the pyrolysis gas buffer zone 114 and connected to the waste gas processing device 400 for discharging the used gas to meet the environmental regulation;

a condensing tube 201 connected to the pyrolysis gas buffer zone 114 of the reactor with a condensing & spraying device 202 therein so as to mix the moisture and the pyrolysis gas passing through the condensing tube 201 to generate a liquid tar (the mixture of oil and carbon ash) and to guide it to the condensing tank 203 with a hydraulic seal and then to the gas & water separating tank 208 to separate the tar 204 and the incondensible gas to obtain the tar, while the used gas is transferred through the gas outlet 205 to the temporary gas storage zone 210; wherein the temporary gas storage zone 210 has its rear end connected with a pipe 300 and also connected to the waste gas processing device 400, the waste gas processing device 400 is disposed with a exhaust outlet 500 for discharging the processed gas to the outside or can compress the gas in the temporary gas storage zone 210 into liquidized gas;

a condensing & spraying device 202 disposed at the front end of the condensing tube 201 for directly or indirectly cooling the reactant, wherein the condensing & spraying device comprises a pressurizing pump 206 connected to a lower end of the gas & water separating tank 208 to form a complete system; wherein the condensing & spraying device uses forced draft cooling or liquid cooling for lowering the water temperature;

a tar outlet 207 disposed above the water of the gas & water separating tank for removing the tar and leaving water in the gas & water separating tank 208; wherein the hydraulic seal can be replaced by an oil seal;

a waste gas processing device 400 disposed at the gas outlet 300 of the temporary gas storage zone 210, wherein the used gas processing device uses a traditional organic gas and nitrogen gas processing device to process the waste gas or burns the waste gas directly to obtain the heat energy for power generation and then discharge the processed gas safely Now please refer to FIG. 7A to 7E for implementation views of a method and a device using pyrolysis for recycling a used printed circuit board; in which the reaction rack transfer driver 107 is driven to connect the reaction rack connector 109 to the reaction rack 110 (as shown in FIG. 7A), then a plurality of reactants 120 is vertically inserted into the reaction rack 110 and the cover 105 on the very top of the reactor 100 is open (as shown in FIG. 7B) to lower the reaction rack 110 to the inside of the reactor 100, the movable sealing door 104 suitably positioned on the reaction rack 109 will temporarily close the top end of the reactor 100 to prevent outside air from coming into the reactor 100; when the reactants 120 in the reaction rack 110 are totally dipped in the melted nitrate 102, the pyrolysis process starts (as shown in FIG. 7C), the reaction time for the pyrolysis process is about 1 to 5 minutes; during the pyrolysis reaction, the generated gas is discharged through the reactor gas outlet 112 to the movable hydraulic seal 113; when the pyrolysis reaction is totally finished, the reaction rack 110 is lifted upward and the reactants are cooled by the moisture (as shown in FIG. 7D); and the cover 105 is placed on the opening at the very top of the reactor 100 (as shown in FIG. 7E), hence the pyrolysis process is done.

The pyrolysis reaction period of the reactant 120 in the melted nitrate 102 is preferably three minutes.

The present invention discloses a method and a device using pyrolysis for recycling used printed circuit board, while compared with other prior art techniques, is advantageous in:

1. The present invention provides a device which can ensure the safety of the pyrolysis process by preventing combustion in the reactor, thereby protecting the operator and ensuring the safety for the working environment.

2. The present invention can treat the pyrolysis gas by condensation and purification to obtain reusable fuel or chemical materials, thereby greatly reducing processing cost, improving recycling efficiency and providing processing device with high safety to enhance industry usability.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A method using pyrolysis for recycling a used printed circuit board, comprising the following steps:
    Step 1: dipping a used printed circuit board into melted nitrate in a reactor to start a pyrolysis process and chemical reactions, wherein water is introduced in the reactor for cooling the used printed circuit board and melted nitrate to stabilize the pyrolysis process and to maintain a positive pressure with moisture generated by heating the water, thereby removing oxygen and forcibly discharging pyrolysis gas out of the reactor;
    Step 2: using a room temperature condensing/compressing and recycling system to condense the pyrolysis gas to sort out fuel and gas for recycling;
    Step 3: separating out the melted nitrate after the pyrolysis process by using water; wherein nitrate and halide are sorted out based on their different densities and melting points;
    Step 4: separating salt and carbon residue in carbon film generated in the pyrolysis process by using water
    Step 5: separating glass fiber and metals, wherein if solder mask copper foil is not melted, then the solder mask copper foil is separated from the used printed circuit board by applying an external force or through chemical reduction.

2. The method using pyrolysis for recycling a used printed circuit board as claimed in claim 1, wherein the moisture is a small amount of water, vaporized water, or steam.

3. The method using pyrolysis for recycling a used printed circuit board as claimed in claim 1, wherein in Step 2 the pyrolysis gas is condensed by mixing water and the pyrolysis gas, mixing oil and the pyrolysis gas, or using an indirect heat exchanger.

4. The method using pyrolysis for recycling a used printed circuit board as claim in claim 1, wherein the used printed circuit board is dipped into the melted nitrate for executing the pyrolysis process after a pre-processing, in which all components on the used printed circuit board are removed; tin is also removed from the used printed circuit board; or tin and solder mask copper foil are both removed from the used printed circuit board.

5. The method using pyrolysis for recycling a used printed circuit board as claimed in claim 1, wherein the melted nitrate is lithium nitrate, sodium nitrate, potassium nitrate, or a combination thereof.

* * * * *